(12) United States Patent
Ota et al.

(10) Patent No.: US 8,901,628 B2
(45) Date of Patent: Dec. 2, 2014

(54) IMAGE SENSOR IN WHICH EMBEDDED PHOTODIODES ARE ARRAYED

(75) Inventors: Keiichi Ota, Hamamatsu (JP); Sadaharu Takimoto, Hamamatsu (JP); Hiroshi Watanabe, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 13/201,289

(22) PCT Filed: Feb. 8, 2010

(86) PCT No.: PCT/JP2010/051808
§ 371 (c)(1),
(2), (4) Date: Aug. 12, 2011

(87) PCT Pub. No.: WO2010/092929
PCT Pub. Date: Aug. 19, 2010

(65) Prior Publication Data
US 2011/0291216 A1 Dec. 1, 2011

(30) Foreign Application Priority Data
Feb. 13, 2009 (JP) ................................ 2009-031221

(51) Int. Cl.
*H01L 31/062* (2012.01)
*H01L 31/113* (2006.01)
*H01L 27/14* (2006.01)
*H01L 27/146* (2006.01)

(52) U.S. Cl.
CPC .... *H01L 27/14603* (2013.01); *H01L 27/14689* (2013.01); *H01L 27/1461* (2013.01); *H01L 27/14623* (2013.01)
USPC .............................. 257/291; 257/431; 438/73

(58) Field of Classification Search
None
See application file for complete search history.

(56) References Cited

U.S. PATENT DOCUMENTS

| 6,040,593 A | | 3/2000 | Park |
| 6,150,676 A | * | 11/2000 | Sasaki ........................... 257/191 |
| 6,150,704 A | * | 11/2000 | Kozuka ......................... 257/434 |

(Continued)

FOREIGN PATENT DOCUMENTS

| CN | 1217580 | 5/1999 |
| CN | 1747177 A | 3/2006 |

(Continued)

OTHER PUBLICATIONS

U.S. Office Action dated Oct. 24, 2012 that issued in U.S. Appl. No. 13/148,514 including Double Patenting Rejections on pp. 6-9.

*Primary Examiner* — Andres Munoz
(74) *Attorney, Agent, or Firm* — Drinker Biddle & Reath LLP

(57) ABSTRACT

In an image sensor 1 according to an embodiment of the present invention, a plurality of embedded photodiodes PD(m,n) are arrayed. Each of the embedded photodiodes PD(m,n) comprises a first semiconductor region 10 of a first conductivity type; a second semiconductor region 20 formed on the first semiconductor region 10 and having a low concentration of an impurity of a second conductivity type; a third semiconductor region 30 of the first conductivity type formed on the second semiconductor region 20 so as to cover a surface of the second semiconductor region 20; and a fourth semiconductor region 40 of the second conductivity type for extraction of charge from the second semiconductor region 20; the fourth semiconductor region 40 comprises a plurality of fourth semiconductor regions 40 arranged as separated, on the second semiconductor region 20.

5 Claims, 9 Drawing Sheets

(56) References Cited

U.S. PATENT DOCUMENTS

| | | | |
|---|---|---|---|
| 2003/0107107 A1* | 6/2003 | Chang et al. | 257/590 |
| 2006/0086955 A1* | 4/2006 | Iwata | 257/226 |
| 2008/0128767 A1 | 6/2008 | Adkisson et al. | |
| 2011/0291216 A1 | 12/2011 | Ota et al. | |
| 2012/0018834 A1* | 1/2012 | Ota et al. | 257/443 |

FOREIGN PATENT DOCUMENTS

| | | |
|---|---|---|
| CN | 1933187 A | 3/2007 |
| CN | 1992309 | 7/2007 |
| CN | 101305261 A | 11/2008 |
| EP | 1052697 A2 | 11/2000 |
| EP | 1310999 | 5/2003 |
| JP | 61-40056 | 2/1986 |
| JP | 4-3473 | 1/1992 |
| JP | 11-112006 | 4/1999 |
| JP | 11-298033 | 10/1999 |
| JP | 2000-236081 | 8/2000 |
| JP | 2000-311997 | 11/2000 |
| JP | 2002-324908 A | 11/2002 |
| JP | 2006-41189 | 2/2006 |
| JP | 2006-080306 A | 3/2006 |
| JP | 2006-093442 A | 4/2006 |
| JP | 2007-005697 A | 1/2007 |
| JP | 2007-180538 | 7/2007 |
| WO | WO-2008/123597 A2 | 10/2008 |

* cited by examiner

Fig.7
(a)
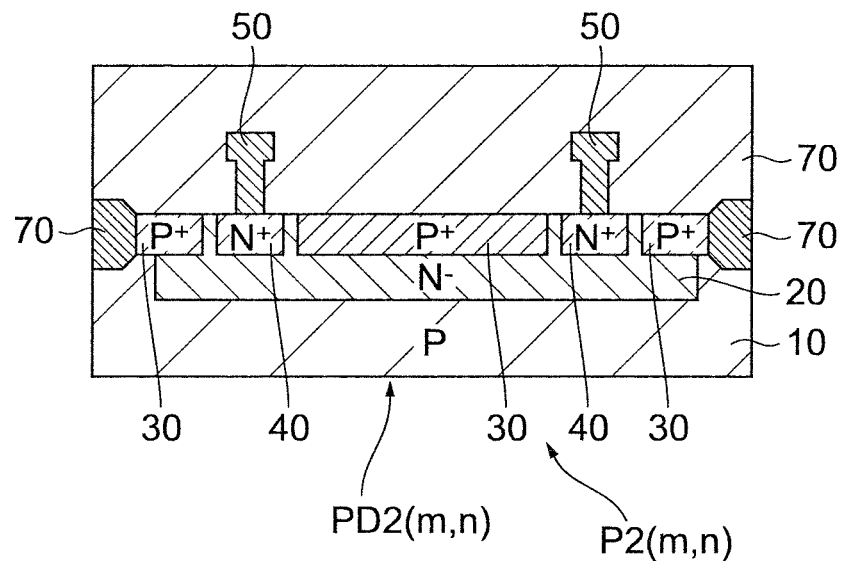
(b)
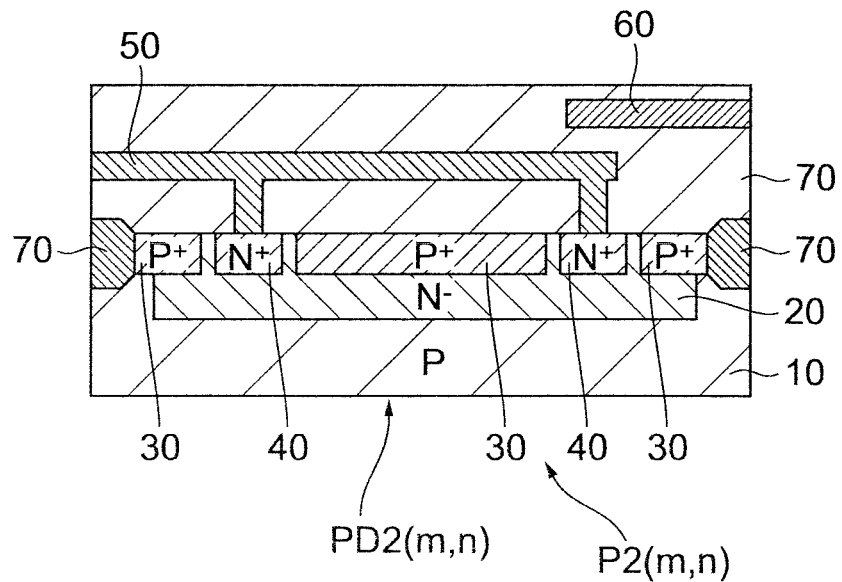

IMAGE SENSOR IN WHICH EMBEDDED PHOTODIODES ARE ARRAYED

TECHNICAL FIELD

The present invention relates to an image sensor in which a plurality of embedded photodiodes are arrayed.

BACKGROUND ART

For example, there is a known image sensor consisting of a two-dimensional array of light receiving portions with embedded photodiodes. In each of the embedded photodiodes, for example, an n-type low-concentration semiconductor region is formed on a p-type substrate and a thin p-type high-concentration semiconductor region is formed on a surface of this n-type low-concentration semiconductor region. For readout of charge, an n-type high-concentration semiconductor region is formed on the n-type low-concentration semiconductor region. Since the n-type low-concentration semiconductor region can be completely depleted in this embedded photodiode, charge generated in a pn junction part can be completely read out and occurrence of leak current is suppressed, so as to achieve excellent S/N ratios in detection of light.

In this embedded photodiode, the sensitivity of detection of light can be improved by increasing the area of the photosensitive region or the area of the n-type low-concentration semiconductor region and p-type high-concentration semiconductor region. However, the increase in the area of the n-type low-concentration semiconductor region will lead to incomplete readout of the generated charge, so as to leave a remnant charge in readout. As a result, image lag will occur.

With regard to this problem, the image sensor described in Patent Literature 1 has an impurity concentration slope from an edge of a p-type charge accumulation region 206 (which correspond to the n-type low-concentration semiconductor region being the photosensitive region mentioned above) in the embedded photodiode formed on a n-type substrate 201 instead of the p-type substrate toward a transfer electrode 103 (which correspond to the n-type high-concentration semiconductor region being a transfer electrode for readout of charge mentioned above), so as to lower a potential. Patent Literature 1 describes that this configuration reduces the remnant charge in readout.

CITATION LIST

Patent Literature

Patent Literature 1: Japanese Patent Application Laid-open No. 2000-236081
Patent Literature 2: Japanese Patent Application Laid-open No. 2006-41189

SUMMARY OF INVENTION

Technical Problem

In order to form the potential gradient in the n-type low-concentration semiconductor region in the embedded photodiode as in the image sensor described in Patent Literature 1, however, it is necessary to form a surface with a stepped impurity concentration distribution, or a p-type high-concentration semiconductor region. Since delicate control on ion injection amounts is required for production of the stepped impurity concentration distribution, the degree of difficulty in terms of process is high and there is a need for a plurality of photolithography masks and photolithography steps, which might raise production cost.

It is therefore an object of the present invention to provide an image sensor capable of reducing the remnant charge in readout easier than before.

Solution to Problem

An image sensor of the present invention is an image sensor in which a plurality of embedded photodiodes are arrayed. Each of the embedded photodiodes comprises a first semiconductor region of a first conductivity type; a second semiconductor region formed on the first semiconductor region and having a low concentration of an impurity of a second conductivity type; a third semiconductor region of the first conductivity type formed on the second semiconductor region so as to cover a surface of the second semiconductor region; and a fourth semiconductor region of the second conductivity type for extraction of charge from the second semiconductor region; the fourth semiconductor region comprises a plurality of fourth semiconductor regions arranged as separated, on the second semiconductor region.

Since this image sensor comprises the plurality of fourth semiconductor regions for extraction of charge from the second semiconductor region (photosensitive region) arranged as separated, the distance can be appropriately made short from the fourth semiconductor regions to an edge of the second semiconductor region even if the n-type low-concentration semiconductor region has a large area. Therefore, a sufficient potential gradient to the fourth semiconductor regions can be ensured in the embedded photodiode, which can reduce the remnant charge in readout of charge from the second semiconductor region. As a result, it is feasible to suppress the occurrence of image lag.

Since this image sensor is realized by simply forming the plurality of fourth semiconductor regions for extraction of charge from the second semiconductor region, the remnant charge in readout can be reduced easier than before.

The aforementioned image sensor preferably comprises a light blocking film covering the fourth semiconductor regions and a part of an interconnection connected to the fourth semiconductor regions, the light blocking film extending in an array direction.

In the case where the shape of a substantial photosensitive region is not bilaterally symmetric nor up-and-down symmetric because of the fourth semiconductor regions and the interconnection connected to the fourth semiconductor regions, when incident light impinges over adjacent pixels and on a charge readout line of the embedded photodiode in one pixel, a discrepancy can be made between light detection sensitivities of the adjacent pixels because of asymmetry of the substantial photosensitive region.

However, the aforementioned configuration comprises the light blocking film extending in the array direction so as to cover the fourth semiconductor regions and the interconnection connected to the fourth semiconductor region, whereby the shape of the photosensitive region can be made bilaterally symmetric and up-and-down symmetric with respect to the center axis of the pixel. Therefore, the discrepancy between the light detection sensitivities of the adjacent pixels can be reduced even if light impinges over the adjacent pixels.

Advantageous Effects of Invention

The present invention allows the image sensor to reduce the remnant charge in readout easier than before. As a result, it is feasible to suppress the occurrence of image lag.

BRIEF DESCRIPTION OF DRAWINGS

FIG. 7 is a drawing showing cross sections of the pixel along the lines VII-VII in FIG. 6.

DESCRIPTION OF EMBODIMENTS

The preferred embodiments of the present invention will be described below in detail with reference to the drawings. In each drawing, identical or equivalent portions will be denoted by the same reference signs.

Figure 1:
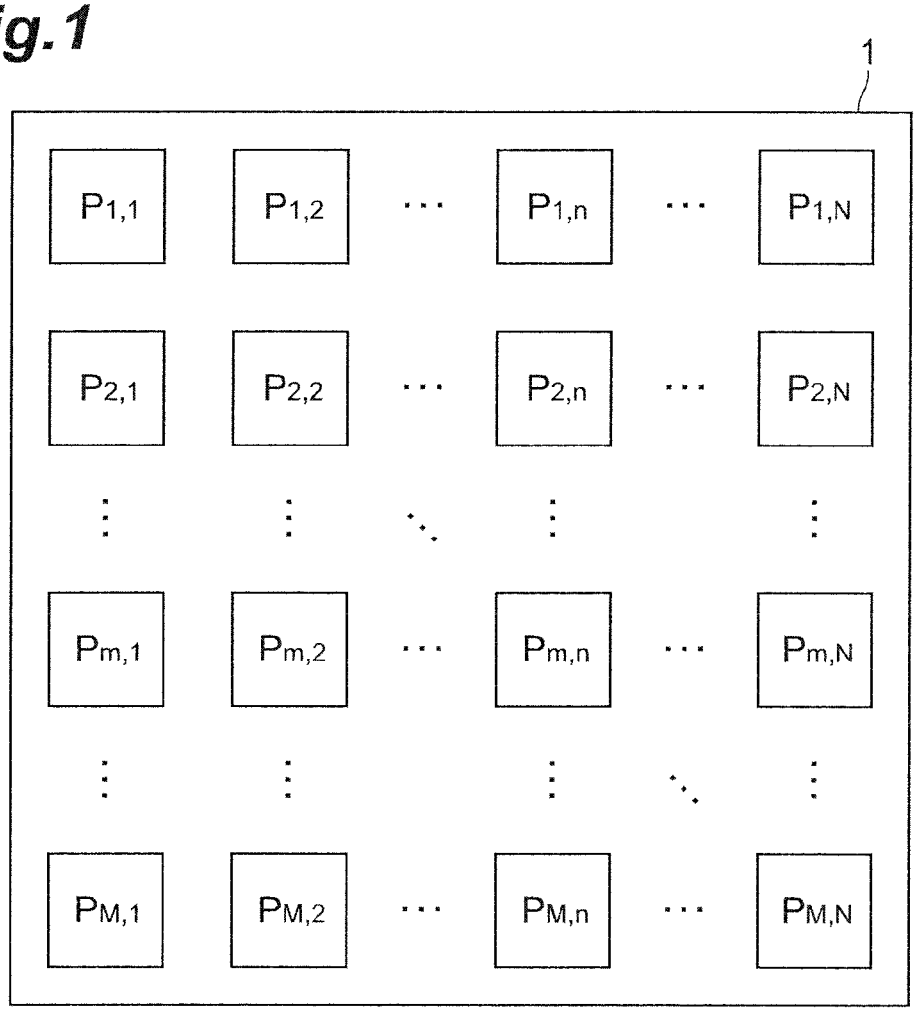
FIG. 1 is a drawing showing a configuration of an image sensor according to an embodiment of the present invention.

FIG. 1 is a drawing showing a configuration of an image sensor according to an embodiment of the present invention. The image sensor 1 shown in FIG. 1 is provided with M×N pixels P(m,n) (in M rows and N columns) arranged in a two-dimensional array. Here, M is an integer of not less than 2 and m any integer of not less than 1 and not more than M. Furthermore, N is an integer of not less than 2 and n any integer of not less than 1 and not more than N. FIG. 1 is drawn without illustration of a control section for controlling operations of the respective pixels P(m,n), a signal processing section for processing signals read out of the respective pixels P(m,n), and so on, in order to clearly show the feature of the present invention. A plurality of embodiments will be described below as examples of the pixels P(m,n) having the feature of the present invention.

First Embodiment

Figure 2:
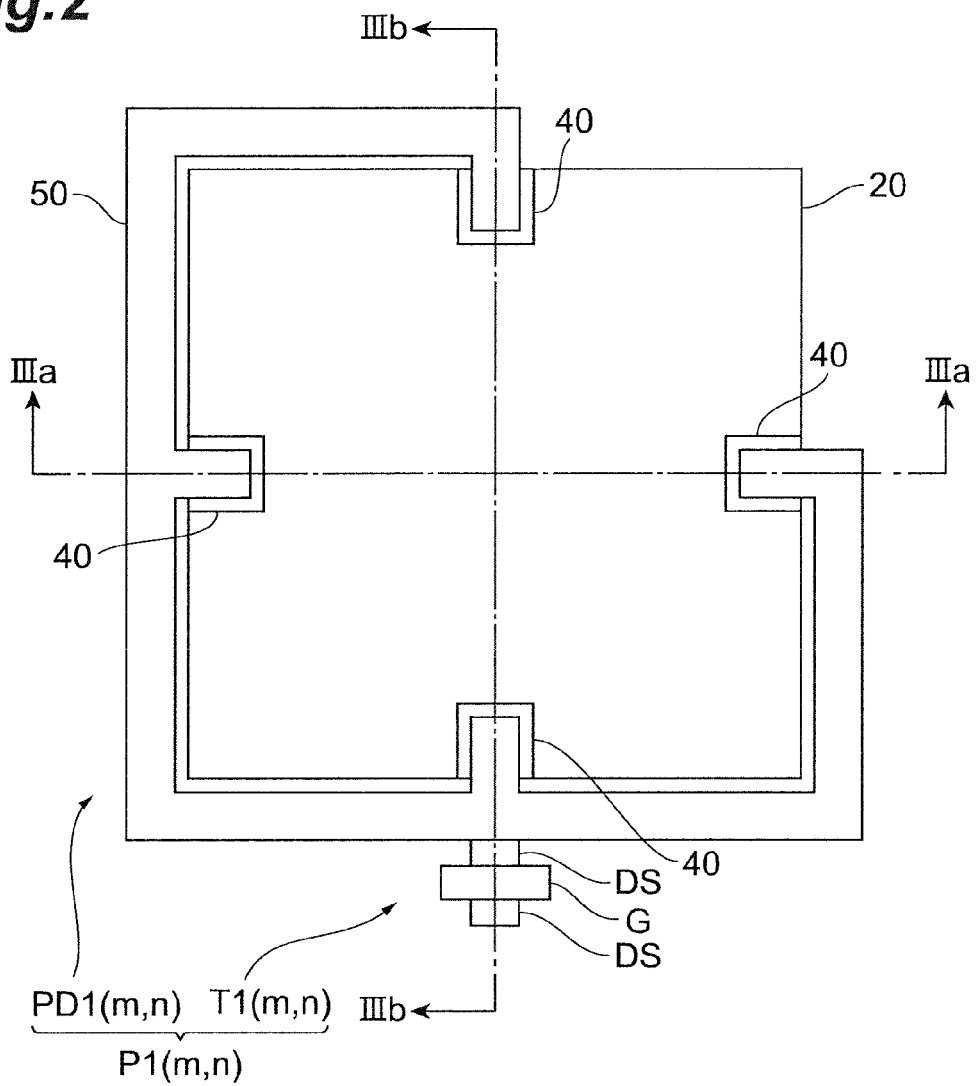
FIG. 2 is a drawing showing the first embodiment of pixels shown in FIG. 1, which shows a pixel viewed from the front side.
Figure 3:
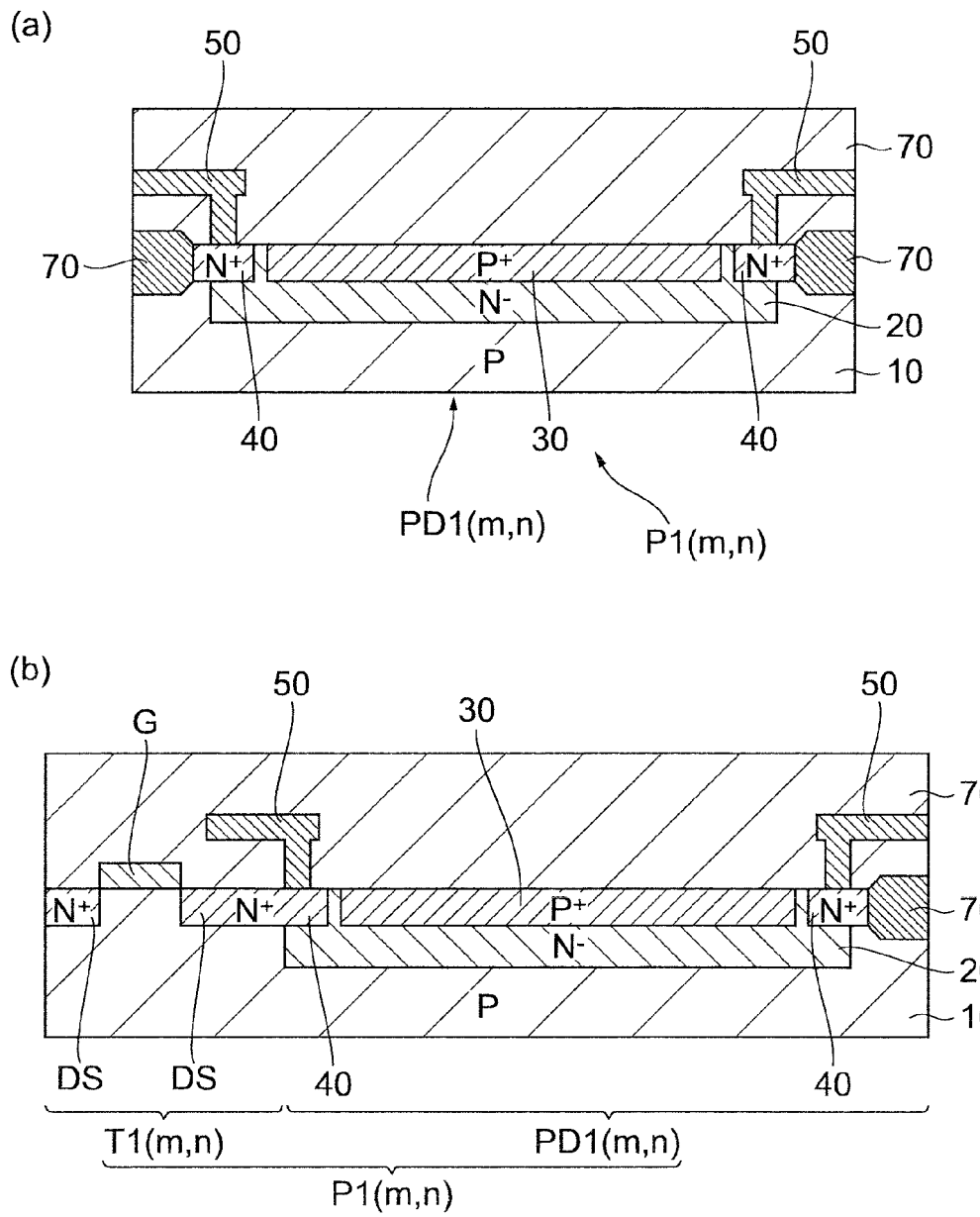
FIG. 3 is a drawing showing cross sections of the pixel along the lines in FIG. 2.

FIG. 2 is a drawing showing the first embodiment of the pixels P(m,n) shown in FIG. 1, which shows the pixel P1($m,n$) viewed from the front side, and FIG. 3 is a drawing showing cross sections of the pixel P1($m,n$) along the lines in FIG. 2. In FIGS. 2 and 3, the pixel P1($m,n$) in the mth row and the nth column is shown on behalf of the M×N pixels P1($m,n$). This pixel P1($m,n$) has an embedded photodiode PD1($m,n$) and a transistor T1($m,n$). FIG. 2 is drawn without illustration of below-described p-type high-concentration semiconductor region 30 in the embedded photodiode PD1($m,n$), for easier understanding of the feature of the present invention.

The embedded photodiode PD1($m,n$) has a p-type substrate 10, an n-type low-concentration semiconductor region 20 formed on this p-type substrate 10, a p-type high-concentration semiconductor region 30 formed on this n-type low-concentration semiconductor region 20, and a plurality of n-type high-concentration semiconductor regions 40 formed on the n-type low-concentration semiconductor region 20. These p-type substrate 10, n-type low-concentration semiconductor region 20, p-type high-concentration semiconductor region 30, and n-type high-concentration semiconductor regions 40 correspond to the first semiconductor region, the second semiconductor region, the third semiconductor region, and the fourth semiconductor regions, respectively, described in the scope of claims, and the p-type and the n-type correspond to the first conductivity type and the second conductivity type, respectively, described in the scope of claims.

A p-type impurity concentration of the p-type substrate 10 is, for example, approximately $10^{15}$ cm$^{-3}$ to $10^{17}$ cm$^{-3}$. On the p-type substrate 10, the n-type low-concentration semiconductor region 20 is formed so as to be embedded in a portion of the p-type substrate 10.

The n-type low-concentration semiconductor region 20 is of a rectangular shape (e.g., a nearly square shape). For example, the n-type low-concentration semiconductor region 20 has the thickness of about 0.6 μm to 1.0 μm, and an n-type impurity concentration of the n-type low-concentration semiconductor region 20 is relatively low, about $10^{16}$ cm$^{-3}$ to $10^{18}$ cm$^{-3}$. The p-type high-concentration semiconductor region 30 and n-type high-concentration semiconductor regions 40 are formed on a surface of the n-type low-concentration semiconductor region 20.

The p-type high-concentration semiconductor region 30 is formed so as to cover the surface of the n-type low-concentration semiconductor region 20 and the thickness thereof is small, 0.2 μm to 0.4 μm. A p-type impurity concentration of the p-type high-concentration semiconductor region 30 is relatively high, about $10^{17}$ cm$^{-3}$ to $10^{19}$ cm$^{-3}$.

These p-type substrate 10, n-type low-concentration semiconductor region 20, and p-type high-concentration semiconductor region 30 form a photosensitive region and an amount of charge generated according to an intensity of light incident into this photosensitive region is accumulated in a pn junction part formed by the p-type substrate 10 and the n-type low-concentration semiconductor region 20 and in a pn junction part formed by the n-type low-concentration semiconductor region 20 and the p-type high-concentration semiconductor region 30.

Since the n-type impurity concentration of the n-type low-concentration semiconductor region 20 is low as described above, the n-type low-concentration semiconductor region 20 can be completely depleted, and therefore the charge generated in the pn junction parts can be completely read out.

By forming the thin p-type high-concentration semiconductor region 30 on the surface of the n-type low-concentration semiconductor region 20, the p-type high-concentration semiconductor region 30, or the substrate surface can be prevented from being depleted even if the n-type low-concentration semiconductor region 20 is completely depleted. As a result, a leak current (dark current), which can be generated due to charge possibly existing on the substrate surface, can be reduced, which can increase S/N ratios in detection of light.

On the other hand, the n-type high-concentration semiconductor regions 40 are formed at a plurality of locations (e.g., four locations) so as to be surrounded by the p-type high-concentration semiconductor region 30. These n-type high-concentration semiconductor regions 40 are arrayed as separated, near centers of the four sides of the n-type low-concentration semiconductor region 20. The thickness of the n-type high-concentration semiconductor regions 40 is relatively small, 0.2 μm to 0.4 μm, and an n-type impurity concentration of the n-type high-concentration semiconductor regions 40 is relatively high, about $10^{19}$ cm$^{-3}$ to $10^{21}$ cm$^{-3}$. These n-type high-concentration semiconductor regions 40 are connected through a contact, a via contact, and an interconnection 50 to the transistor T1($m,n$).

The transistor T1($m,n$) is composed of n-type high-concentration semiconductor regions DS corresponding to a drain and a source, and a gate electrode G. The transistor T1($m,n$) is formed adjacently near the center of one side of the embedded photodiode PD1($m,n$), and, for example, one of the n-type high-concentration semiconductor regions DS also serves as one of the n-type high-concentration semiconductor regions 40 in the embedded photodiode PD(n) and is connected to the interconnection 50 so as to be connected to all the n-type high-concentration semiconductor regions 40. The transistor T1($m,n$) becomes turned on according to a voltage applied to the gate electrode G, whereby the charge from the n-type low-concentration semiconductor region 20 extracted through the n-type high-concentration semiconductor regions 40 can be read from one n-type high-concentration semiconductor region DS into the other n-type high-concentration semiconductor region DS.

The interconnection 50 is arranged on the p-type substrate 10 between the n-type low-concentration semiconductor regions 20 in adjacent embedded photodiodes PD1($m,n$).

The surface and side faces of the substrate are protected by silicon oxide film 70.

The operational effect of the image sensor 1 of the first embodiment will be described below in comparison to an image sensor 1X according to a comparative example of the present invention.

The image sensor 1X according to the comparative example of the present invention is provided with M×N pixels Px(m,n) arranged in a two-dimensional array, as the image sensor 1 of the first embodiment shown in FIG. 1 is, and these pixels Px(m,n) are different from those in the first embodiment in that each pixel has a configuration having an embedded photodiode PDx(m,n) instead of the embedded photodiode PD(m,n). The other configuration of the image sensor 1X is the same as that of the image sensor 1. The image sensor 1X is the same as that described in Patent Literature 2.

Figure 4:
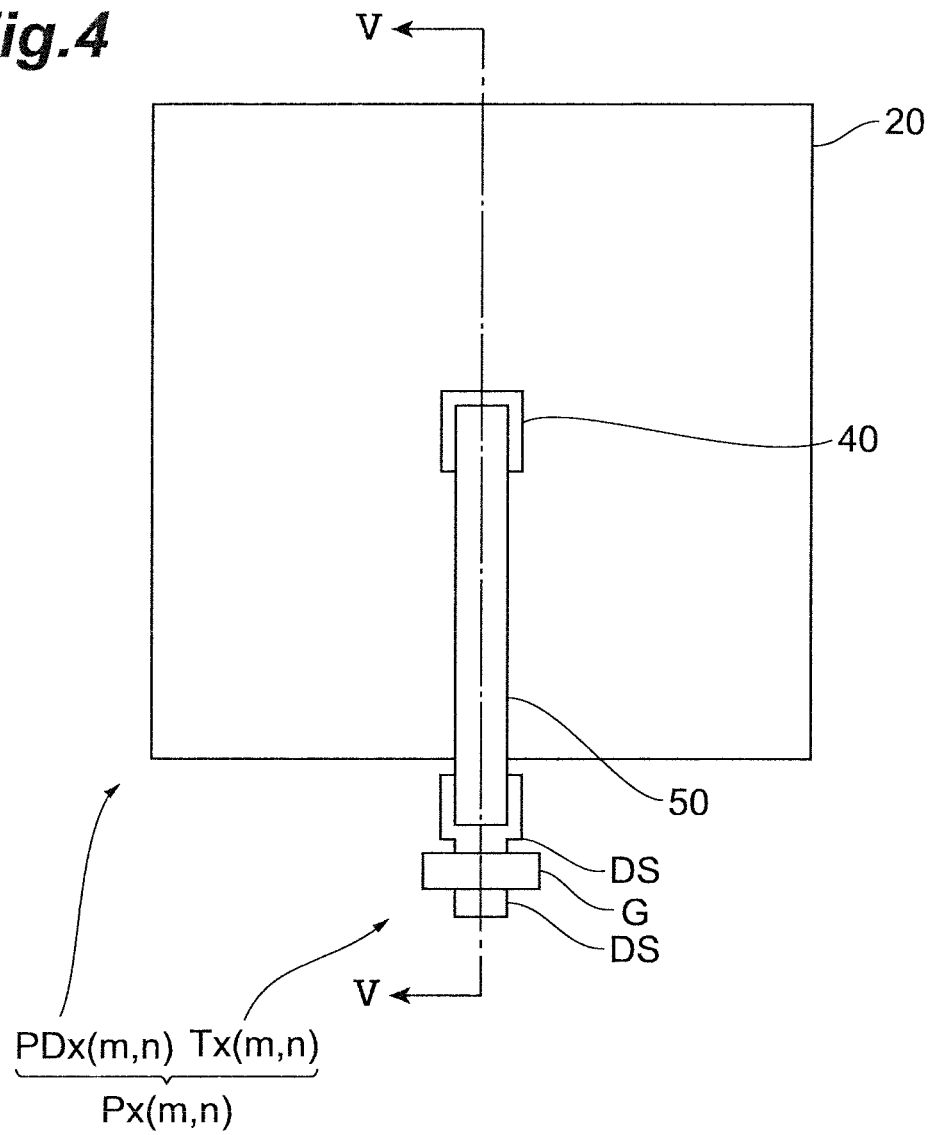
FIG. 4 is a drawing of a pixel in a comparative example of the present invention viewed from the front side.
Figure 5:
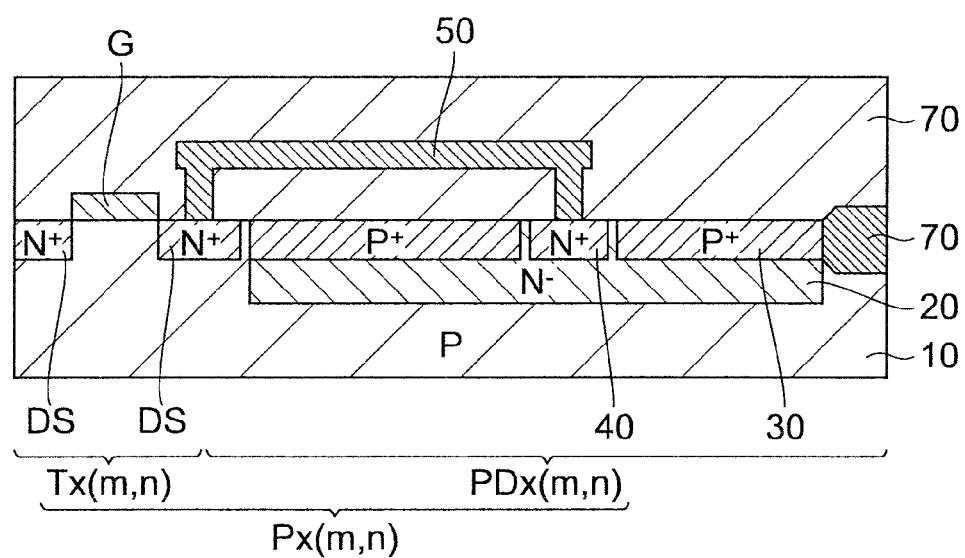
FIG. 5 is a drawing showing a cross section of the pixel along the line V-V in FIG. 4.

FIG. 4 is a drawing of the pixel Px(m,n) of the comparative example viewed from the front side in a lamination direction and FIG. 5 is a drawing showing a cross section of the pixel Px(m,n) along the line V-V in FIG. 4. FIG. 4 is also drawn without illustration of the p-type high-concentration semiconductor region 30 in the embedded photodiode PDx(m,n).

The embedded photodiode PDx(m,n) of the comparative example is different in the number of n-type high-concentration semiconductor regions 40 from the embedded photodiode PD(m,n) of the first embodiment. Namely, the embedded photodiode PDx(m,n) of the comparative example has only one n-type high-concentration semiconductor region 40 for extraction of charge, near the center of the n-type low-concentration semiconductor region 20.

In the case of this embedded photodiode PDx(m,n) of the comparative example, if the n-type low-concentration semiconductor region 20 has a large area, the distance will be long from the n-type high-concentration semiconductor region 40 to the edge of the n-type low-concentration semiconductor region 20. For this reason, a potential gradient from the edge of the n-type low-concentration semiconductor region 20 to the n-type high-concentration semiconductor region 40 becomes almost null and it becomes difficult to extract the charge at the edge of the n-type low-concentration semiconductor region 20, which can leave a remnant charge in readout. As a result, the image lag can occur.

In the case of the image sensor 1 with the embedded photodiodes PD1($m,n$) and pixels P1($m,n$) of the first embodiment, however, the plurality of n-type high-concentration semiconductor regions (fourth semiconductor regions) 40 for extraction of charge from the n-type low-concentration semiconductor region (second semiconductor region; photosensitive region) 20 are arranged as separated; therefore, even if the n-type low-concentration semiconductor region 20 has a large area, the distance can be appropriately made short from the n-type high-concentration semiconductor regions 40 to the edge of the n-type low-concentration semiconductor region 20. Therefore, a sufficient potential gradient to the fourth semiconductor regions can be ensured in the embedded photodiode PD1($m,n$), which can reduce the remnant charge in readout of charge from the n-type low-concentration semiconductor region 20. As a result, it is feasible to suppress the occurrence of image lag.

Since the image sensor 1 of the first embodiment is realized by simply forming the plurality of n-type high-concentration semiconductor regions 40 for extraction of charge from the n-type low-concentration semiconductor region 20, the remnant charge in readout can be reduced easier than before.

In the image sensor 1 of the first embodiment, the n-type high-concentration semiconductor regions 40 for extraction of charge from the n-type low-concentration semiconductor region 20 are formed near the four sides of the n-type low-concentration semiconductor region 20 and the interconnection 50 is arranged on the p-type substrate 10 between the n-type low-concentration semiconductor regions 20; therefore, the n-type low-concentration semiconductor region 20 and the p-type high-concentration semiconductor region 30 forming the photosensitive region are prevented from being covered by the interconnection 50. As a result, it is feasible to increase an aperture ratio of the photosensitive region and to improve the sensitivity of detection of light.

Second Embodiment

Figure 6:
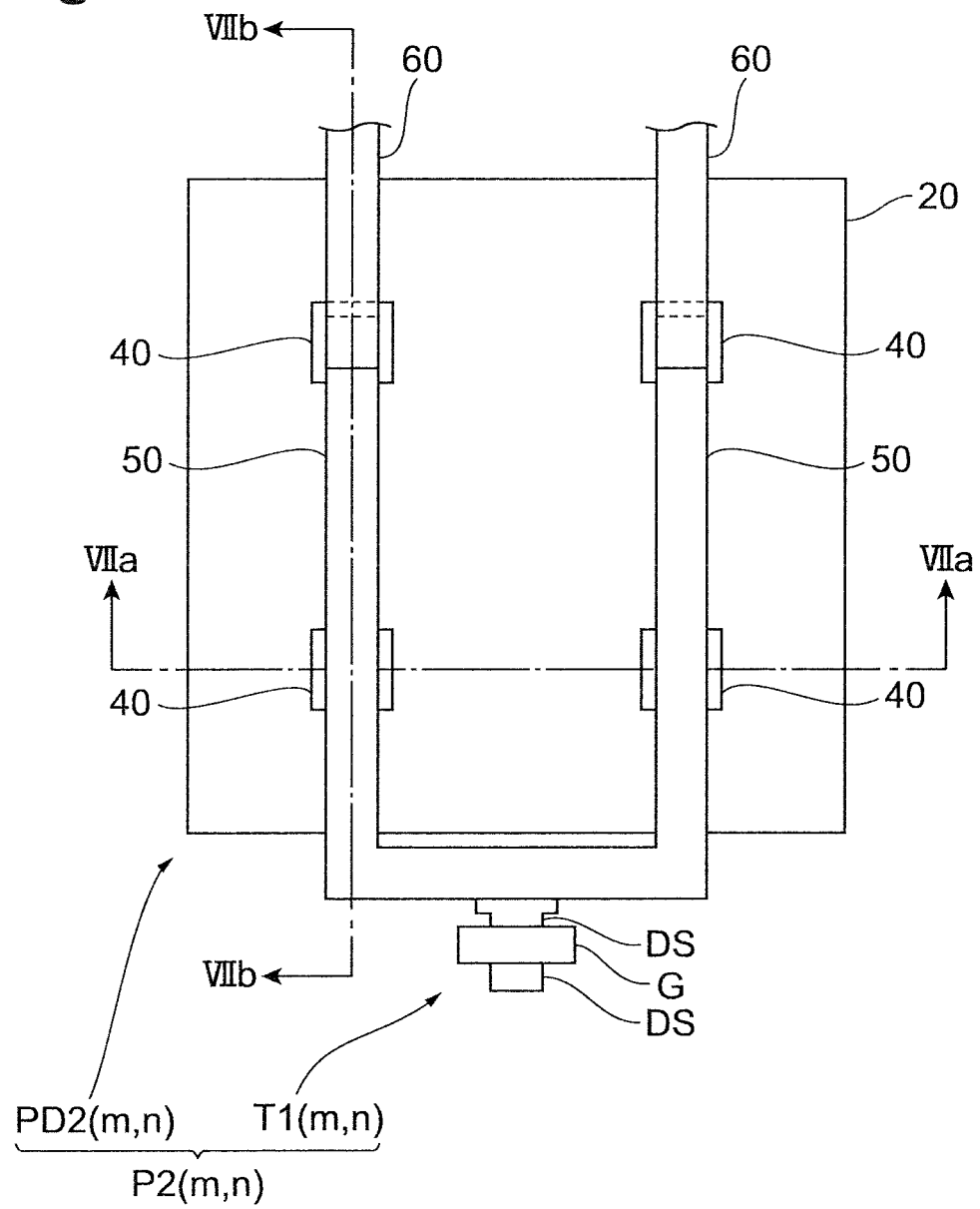
FIG. 6 is a drawing showing the second embodiment of the pixels shown in FIG. 1, which shows a pixel viewed from the front side.

FIG. 6 is a drawing showing the second embodiment of the pixels P(m,n) shown in FIG. 1, which shows the pixel P2($m,n$) viewed from the front side, and FIG. 7 (a) is a drawing showing a cross section of the pixel P2($m,n$) along the line VIIa-VIIa in FIG. 6. FIG. 7 (b) is a drawing showing a cross section of the pixel P2($m,n$) along the line VIIb-VIIb in FIG. 6. In FIGS. 6 and 7, the pixel P2($m,n$) in the mth row and the nth column is shown on behalf of the M×N pixels P2($m,n$). This pixel P2($m,n$) has an embedded photodiode PD2($m,n$) and the aforementioned transistor T1($m,n$). FIG. 6 is drawn without illustration of below-described p-type high-concentration semiconductor region 30 in the embedded photodiode PD2($m,n$), for easier understanding of the feature of the present invention.

The embedded photodiode PD2($m,n$) of the second embodiment is different in the forming positions of the n-type high-concentration semiconductor regions 40 from the embedded photodiode PD1($m,n$) of the first embodiment. Namely, the plurality of n-type high-concentration semiconductor regions 40 are arranged as separated at nearly equal intervals up and down and left and right in the n-type low-concentration semiconductor region 20. The other configuration of the embedded photodiode PD2($m,n$) is the same as that of the embedded photodiode PD1($m,n$).

The pixel P2($m,n$) of the second embodiment is provided with a plurality of light blocking films 60 (e.g., two films). The light blocking films 60 extend in an array direction of the pixels P(m,n) shown in FIG. 1. In the present embodiment, the light blocking films 60 extend in the column direction. The plurality of light blocking films 60 each are arranged so as to cover the n-type high-concentration semiconductor regions 40 and the interconnection 50 connected to the n-type high-concentration semiconductor regions 40 and extending in the column direction. A material of the light blocking films to be used is Al or the like, and a preferred material is one with a light absorbing property, e.g., TiN or the like which can prevent scattering of light to be detected.

Figure 8:
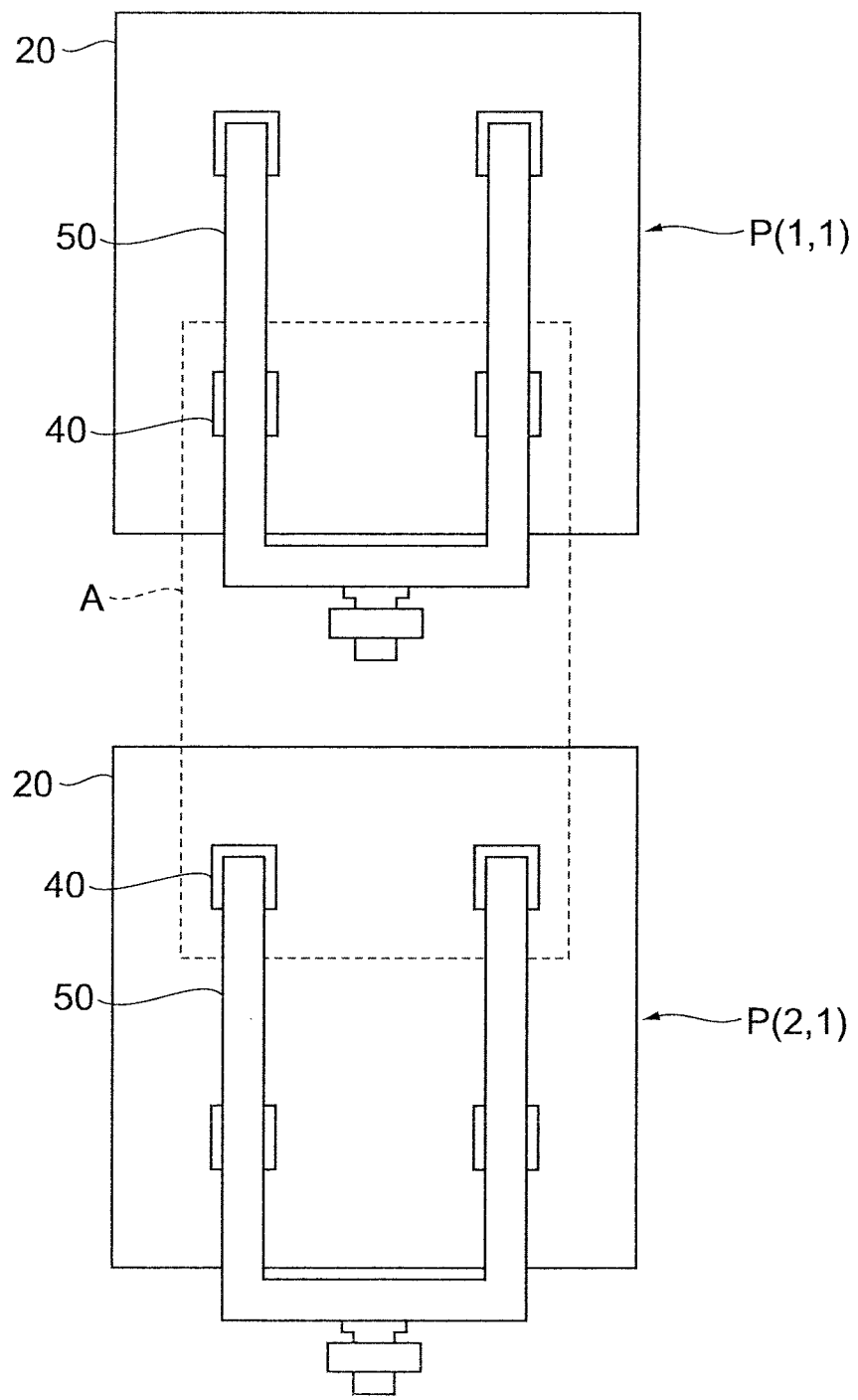
FIG. 8 is a drawing showing a case without light blocking films, where light impinges over adjacent pixels.

The operational effect by the light blocking films 60 will be described below in detail. FIG. 8 is a drawing showing the case without the light blocking films 60, where light impinges over adjacent pixels P2(1,1), P2(2,1), and FIG. 9 is a drawing showing the case with the light blocking films 60, where light impinges over adjacent pixels P2(1,1), P2(2,1).

As shown in FIG. 8, in the case where the pixels P2(m,n) are not provided with the light blocking films 60 and where incident light A impinges over the adjacent pixels P2(1,1), P2(2,1) and on charge readout lines of the embedded photodiode PD2(1,1) in one pixel P2(1,1), the sensitivity of one pixel P2(1,1) becomes lower by the area of the n-type high-concentration semiconductor regions 40 and the interconnection 50 extending in the column direction, which can cause a discrepancy between the light detection sensitivities of the adjacent pixels P2(1,1), P2(2,1).

Figure 9:
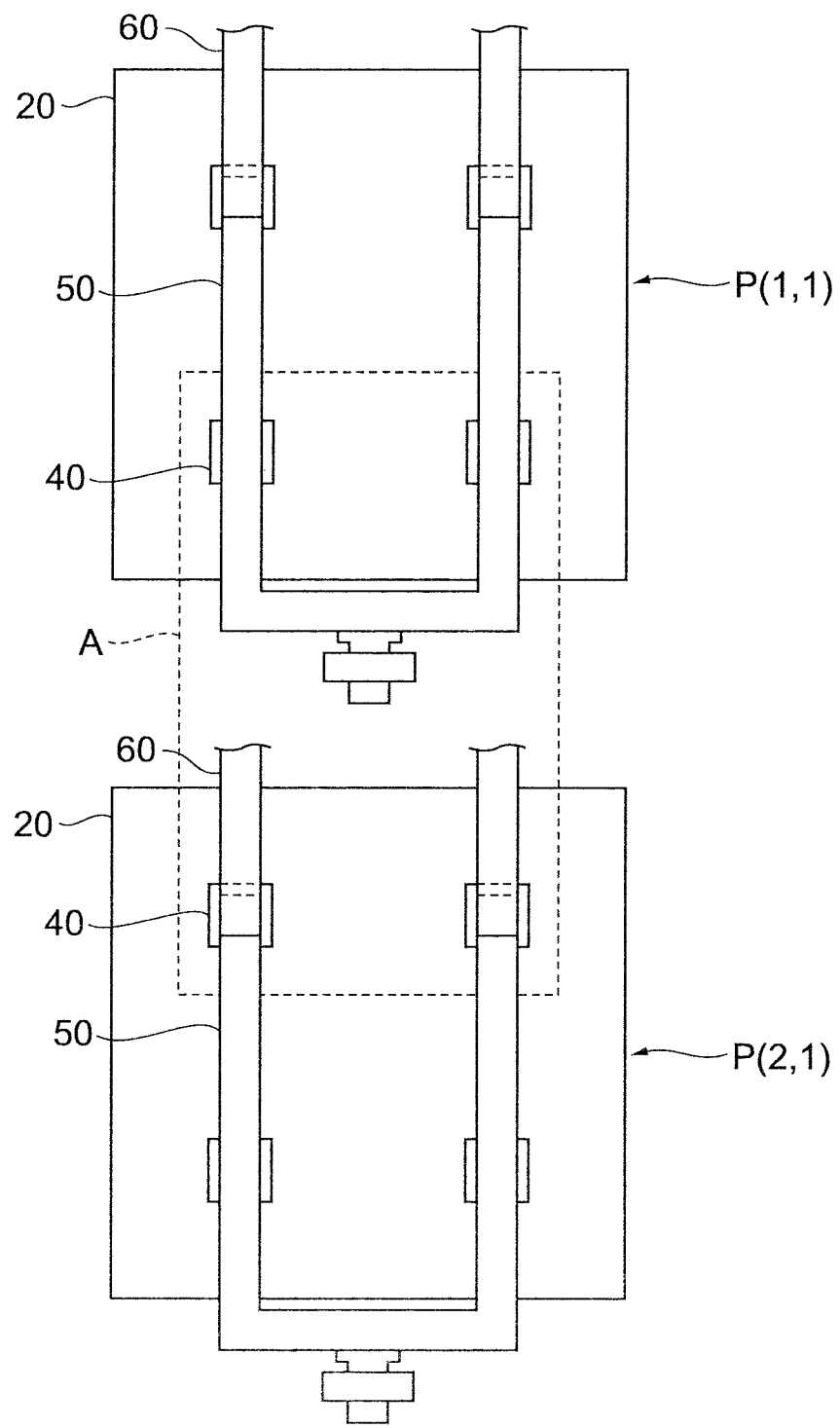
FIG. 9 is a drawing showing a case with light blocking films, where light impinges over adjacent pixels.

However, since the image sensor 1A with the pixels P2(m, n) of the second embodiment is provided with the light blocking films 60 extending in the column direction so as to cover the n-type high-concentration semiconductor regions 40 and the interconnections 50 extending in the column direction as shown in FIG. 9, the shape of the photosensitive region can be made bilaterally symmetric and up-and-down symmetric with respect to a center axis of the pixel P2(m,n). Namely, it is feasible to relax the asymmetry to be caused by the interconnection 50. Therefore, the discrepancy between the light detection sensitivities of the adjacent pixels P2(1,1), P2(2,1) can be reduced even if the light A impinges over the adjacent pixels P2(1,1), P2(2,1).

The present invention can be modified in various ways without having to be limited to the embodiments described above. For example, the embedded photodiodes PD(n) and transistors T(n) are formed directly on the p-type substrate 10 in the embodiments, but they may be formed on an n-type substrate. In this case, a p-type well is formed on the n-type substrate and the same configuration is formed on this p-type well.

INDUSTRIAL APPLICABILITY

The present invention is applicable to usage to reduce the remnant charge in readout from the image sensor.

LIST OF REFERENCE SIGNS 1, 1A, 1X image sensor
P(m,n), P1(m,n), P2(m,n), Px(m,n) pixels
PD(m,n), PD1(m,n), PD2(m,n), PDx(m,n) embedded photodiodes
10 p-type substrate (first semiconductor region)
20 n-type low-concentration semiconductor region (second semiconductor region)
30 p-type high-concentration semiconductor region (third semiconductor region)
40 n-type high-concentration semiconductor regions (fourth semiconductor regions)
50 interconnection
60 light blocking films
70 silicon oxide film
T(m,n), T1(m,n), Tx(m,n) transistor
DS n-type high-concentration semiconductor regions
G gate electrode

The invention claimed is:

1. An image sensor in which a plurality of embedded photodiodes are arrayed, each of the plurality of embedded photodiodes comprising:
a first semiconductor region of a first conductivity type;
a second semiconductor region formed on the first semiconductor region and having a low concentration of an impurity of a second conductivity type;
a third semiconductor region of the first conductivity type formed on the second semiconductor region so as to cover a surface of the second semiconductor region;
a fourth semiconductor region of the second conductivity type for extraction of charge from the second semiconductor region, the fourth semiconductor region having a plurality of fourth semiconductor regions arranged separated on the second semiconductor region; and
a plurality of read-out transistors each arranged adjacently to a corresponding one of the plurality of embedded photodiodes,
wherein each of the plurality of fourth semiconductor regions are arranged separated on the second semiconductor region and are connected to a corresponding interconnection, and each of the plurality of fourth semiconductor regions are formed as islands within a corresponding one of the plurality of embedded photodiodes, and
the corresponding interconnection is connected to a corresponding one of the plurality of read-out transistors for reading out a corresponding fourth semiconductor region,
wherein a semiconductor region that serves as a drain or as a source for each of the plurality of read-out transistors also serves as one of the plurality of fourth semiconductor regions in each of the plurality of embedded photodiodes.

2. The image sensor according to claim 1, further comprising:
a light blocking film covering the plurality of fourth semiconductor regions and a part of the corresponding interconnection connected to the plurality of fourth semiconductor regions, the light blocking film extending in an array direction.

3. The image sensor according to claim 1, wherein
the plurality of fourth semiconductor regions are each arranged near centers of corresponding sides of the second semiconductor region.

4. The image sensor according to claim 1, wherein
the second semiconductor region has a substantially square shape; and
the plurality of fourth semiconductor regions are each arranged near centers of corresponding sides of the second semiconductor region.

5. An image sensor in which a plurality of embedded photodiodes are arrayed, each of the plurality of embedded photodiodes comprising:
a first semiconductor region of a first conductivity type;
a second semiconductor region formed on the first semiconductor region and having a low concentration of an impurity of a second conductivity type;
a third semiconductor region of the first conductivity type formed on the second semiconductor region so as to cover a surface of the second semiconductor region;
a fourth semiconductor region of the second conductivity type for extraction of charge from the second semiconductor region, the fourth semiconductor region having a plurality of fourth semiconductor regions arranged separated on the second semiconductor region; and a plurality of read-out transistors each arranged adjacently to a corresponding one of the plurality of embedded photodiodes, wherein each of the plurality of fourth semiconductor regions are arranged separated on the second semiconductor region and are connected to a corresponding interconnection, and each of the plurality of fourth semiconductor regions are formed as islands within a corresponding one of the plurality of embedded photodiodes, and the corresponding interconnection is connected to a corresponding one of the plurality of read-out transistors for reading out a corresponding fourth semiconductor region, the image sensor further including, a light blocking film covering the plurality of fourth semiconductor regions and a part of the corresponding interconnection connected to the plurality of fourth semiconductor regions, the light blocking film extending in an array direction.

* * * * *